(12) United States Patent
Mahajan et al.

(10) Patent No.: US 12,156,343 B2
(45) Date of Patent: Nov. 26, 2024

(54) ELECTRICAL CONNECTIONS TO EMBEDDED ELECTRONIC COMPONENTS

(71) Applicant: 3M INNOVATIVE PROPERTIES COMPANY, St. Paul, MN (US)

(72) Inventors: Ankit Mahajan, Cupertino, CA (US); Mikhail L Pekurovsky, Bloomington, MN (US); Kara A. Meyers, Oakdale, MN (US); Saagar A. Shah, Minneapolis, MN (US); Kayla C. Niccum, Maplewood, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 131 days.

(21) Appl. No.: 17/758,989

(22) PCT Filed: Jan. 22, 2021

(86) PCT No.: PCT/IB2021/050508
§ 371 (c)(1),
(2) Date: Jul. 18, 2022

(87) PCT Pub. No.: WO2021/149009
PCT Pub. Date: Jul. 29, 2021

(65) Prior Publication Data
US 2023/0354527 A1    Nov. 2, 2023

Related U.S. Application Data

(60) Provisional application No. 62/965,497, filed on Jan. 24, 2020.

(51) Int. Cl.
*H05K 1/11* (2006.01)
*H05K 1/02* (2006.01)
(Continued)

(52) U.S. Cl.
CPC ............. *H05K 3/10* (2013.01); *H05K 1/0277* (2013.01); *H05K 1/11* (2013.01); *H05K 1/189* (2013.01);
(Continued)

(58) Field of Classification Search
CPC ............................... H05K 1/118; H05K 1/144
See application file for complete search history.

(56) References Cited

U.S. PATENT DOCUMENTS

| 5,291,019 A | 3/1994 | Powell et al. |
| 5,446,245 A | 8/1995 | Iwayama et al. |

(Continued)

FOREIGN PATENT DOCUMENTS

| WO | 2018094057 A1 | 5/2018 |
| WO | 2018178821 A2 | 10/2018 |

(Continued)

OTHER PUBLICATIONS

International Search Report for PCT International Application No. PCT/IB2021/050508, mailed on Jun. 22, 2021, 6 pages.

*Primary Examiner* — Jeremy C Norris
(74) *Attorney, Agent, or Firm* — Thomas M. Spielbauer

(57) ABSTRACT

Devices including electrical connections to embedded electronic components and methods of making the same are provided. The devices include a flexible electronic component buried inside a substrate. The free end of the flexible electronic component can be extracted to stick out of the major plane of the substrate as a projecting contact.

18 Claims, 11 Drawing Sheets

(51) Int. Cl.
  *H05K 1/18* (2006.01)
  *H05K 3/10* (2006.01)
  *H05K 3/28* (2006.01)
  *H05K 3/40* (2006.01)
  *H01L 21/48* (2006.01)
  *H01L 23/498* (2006.01)

(52) U.S. Cl.
  CPC ........... H05K 3/285 (2013.01); H05K 3/4007 (2013.01); *H01L 21/4853* (2013.01); *H01L 23/4985* (2013.01)

(56) References Cited

U.S. PATENT DOCUMENTS

| | | |
|---|---|---|
| 7,271,012 B2 | 9/2007 | Anderson |
| 2003/0070833 A1* | 4/2003 | Barth ................... H05K 1/118 |
| | | 174/250 |
| 2008/0314626 A1 | 12/2008 | Moore |
| 2016/0027764 A1* | 1/2016 | Kim ..................... H01L 25/105 |
| | | 257/686 |

FOREIGN PATENT DOCUMENTS

| | | |
|---|---|---|
| WO | 2019171214 A1 | 9/2019 |
| WO | 2019193457 A1 | 10/2019 |
| WO | 2019224670 A1 | 11/2019 |

* cited by examiner

ELECTRICAL CONNECTIONS TO EMBEDDED ELECTRONIC COMPONENTS

CROSS REFERENCE TO RELATED APPLICATIONS

This application is a national stage filing under 35 U.S.C. 371 of PCT/IB2021/050508, filed Jan. 22, 2021, which claims the benefit of U.S. Provisional Patent Application No. 62/965,497, filed Jan. 24, 2020, the disclosure of which is incorporated by reference in its/their entirety herein.

BACKGROUND

Integration of solid semiconductor dies with printing techniques combines the computational prowess of semiconductor technology with the high-throughputs and form-factor flexibility of web-based processes. Flexible hybrid electronics manufacturing requires that semiconductor dies be reliably and accurately registered to printed traces on moving webs. Alignment mechanisms suitable for wafer-based semiconductor devices may not be readily transferred to web-based processes.

SUMMARY

Briefly, in one aspect, the present disclosure describes a method of making a flexible device. The method includes providing a flexible substrate extending along a major plane; providing a flexible electronic component including a free end buried inside the flexible substrate; and extracting the free end of the flexible electronic component such that the free end projects out of the major plane of the flexible substrate.

In another aspect, the present disclosure describes a flexible device including a flexible substrate extending along a major plane; and a flexible electronic component buried inside the flexible substrate. The flexible electronic component includes a free end projecting out of the major plane of the flexible substrate.

In another aspect, the present disclosure describes a method of making a device. The method includes providing a circuit board including one or more contact pads on a major surface thereof; providing an electrically conductive element disposed on the major surface of the circuit board, in contact with the one or more contact pads; providing an adhesive film adhesively bonded to the major surface of the circuit board to secure the electrically conductive element thereon, the adhesive film including one or more through holes aligned with the one or more contact pads of the circuit board; providing a conductive particle-containing liquid in the one or more through holes to contact the one or more contact pads; and solidifying the conductive particle-containing liquid to form one or more electrodes to electrically connect to the one or more contact pads of the circuit board and the electrically conductive element.

In another aspect, the present disclosure describes a device including a circuit board including one or more contact pads on a major surface thereof: an electrically conductive element disposed on the major surface of the circuit board, in contact with the one or more contact pads: an adhesive film adhesively bonded to the major surface of the circuit board to secure the electrically conductive element thereon, the adhesive film including one or more through holes aligned with the one or more contact pads of the circuit board; and one or more electrodes formed in the one or more through holes of the adhesive film to electrically connect to the one or more contact pads of the circuit board and the electrically conductive element.

Various unexpected results and advantages are obtained in exemplary embodiments of the disclosure. One such advantage of exemplary embodiments of the present disclosure is that an embedded electrical contact can be extracted to project out toward an object surface to be detected. In some cases, processes to make electrical contacts can decouple the conduction and adhesion aspects by utilizing a two-material system including conductive inks for forming electrodes and adhesive films for adhesion. This approach enables a low-temperature and short curing cycle, which is beneficial for high volume manufacturing.

Various aspects and advantages of exemplary embodiments of the disclosure have been summarized. The above Summary is not intended to describe each illustrated embodiment or every implementation of the present certain exemplary embodiments of the present disclosure. The Drawings and the Detailed Description that follow more particularly exemplify certain preferred embodiments using the principles disclosed herein.

BRIEF DESCRIPTION OF THE DRAWINGS

The disclosure may be more completely understood in consideration of the following detailed description of various embodiments of the disclosure in connection with the accompanying figures, in which.

Figure 1A:
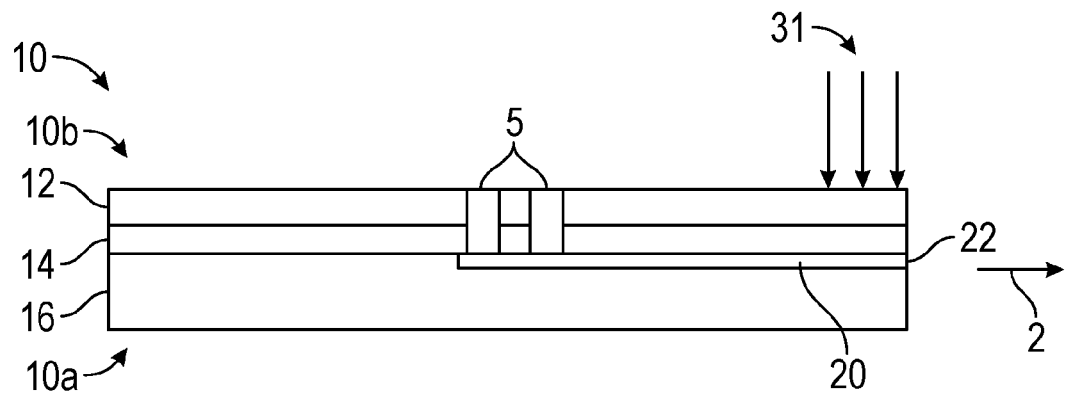
FIG. 1A is a cross-sectional view of a device, according to one embodiment.
Figure 1B:
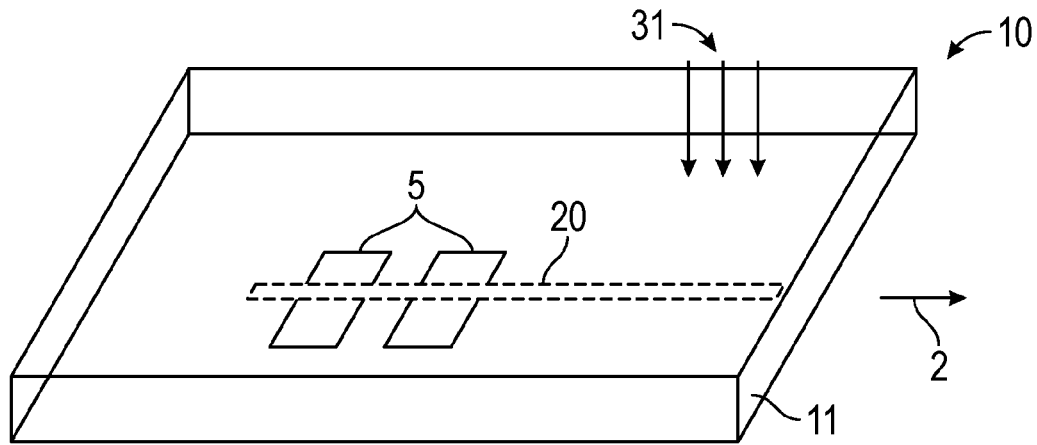
FIG. 1B is a perspective side view of the device of FIG. 1A.

In the drawings, like reference numerals indicate like elements. While the above-identified drawing, which may not be drawn to scale, sets forth various embodiments of the present disclosure, other embodiments are also contemplated, as noted in the Detailed Description. In all cases, this disclosure describes the presently disclosed disclosure by way of representation of exemplary embodiments and not by express limitations. It should be understood that numerous other modifications and embodiments can be devised by those skilled in the art, which fall within the scope and spirit of this disclosure.

DETAILED DESCRIPTION

For the following Glossary of defined terms, these definitions shall be applied for the entire application, unless a different definition is provided in the claims or elsewhere in the specification.

Glossary

Certain terms are used throughout the description and the claims that, while for the most part are well known, may require some explanation. It should be understood that:

By using terms of orientation such as "atop", "on", "over," "covering", "uppermost", "underlying" and the like for the location of various elements in the disclosed coated articles, we refer to the relative position of an element with respect to a horizontally-disposed, upwardly-facing substrate. However, unless otherwise indicated, it is not intended that the substrate or articles should have any particular orientation in space during or after manufacture.

The terms "about" or "approximately" with reference to a numerical value or a shape means+/−five percent of the numerical value or property or characteristic, but expressly includes the exact numerical value. For example, a viscosity of "about" 1 Pa-sec refers to a viscosity from 0.95 to 1.05 Pa-sec, but also expressly includes a viscosity of exactly 1 Pa-sec. Similarly, a perimeter that is "substantially square" is intended to describe a geometric shape having four lateral edges in which each lateral edge has a length which is from 95% to 105% of the length of any other lateral edge, but which also includes a geometric shape in which each lateral edge has exactly the same length.

The term "substantially" with reference to a property or characteristic means that the property or characteristic is exhibited to a greater extent than the opposite of that property or characteristic is exhibited. For example, a substrate that is "substantially" transparent refers to a substrate that transmits more radiation (e.g. visible light) than it fails to transmit (e.g. absorbs and reflects). Thus, a substrate that transmits more than 50% of the visible light incident upon its surface is substantially transparent, but a substrate that transmits 50% or less of the visible light incident upon its surface is not substantially transparent.

As used in this specification and the appended embodiments, the singular forms "a", "an", and "the" include plural referents unless the content clearly dictates otherwise. Thus, for example, reference to fine fibers containing "a compound" includes a mixture of two or more compounds. As used in this specification and the appended embodiments, the term "or" is generally employed in its sense including "and/or" unless the content clearly dictates otherwise.

As used in this specification, the recitation of numerical ranges by endpoints includes all numbers subsumed within that range (e.g. 1 to 5 includes 1, 1.5, 2, 2.75, 3, 3.8, 4, and 5).

Unless otherwise indicated, all numbers expressing quantities or ingredients, measurement of properties and so forth used in the specification and embodiments are to be understood as being modified in all instances by the term "about." Accordingly, unless indicated to the contrary, the numerical parameters set forth in the foregoing specification and attached listing of embodiments can vary depending upon the desired properties sought to be obtained by those skilled in the art utilizing the teachings of the present disclosure. At the very least, and not as an attempt to limit the application of the doctrine of equivalents to the scope of the claimed embodiments, each numerical parameter should at least be construed in light of the number of reported significant digits and by applying ordinary rounding techniques.

Exemplary embodiments of the present disclosure may take on various modifications and alterations without departing from the spirit and scope of the present disclosure. Accordingly, it is to be understood that the embodiments of the present disclosure are not to be limited to the following described exemplary embodiments, but is to be controlled by the limitations set forth in the claims and any equivalents thereof. Various exemplary embodiments of the disclosure will now be described with particular reference to the Drawings.

FIGS. 1A-B and 2A-B illustrate a method of making an electronic device 100 using a flexible substrate 10, according to one embodiment. The flexible substrate 10 extends along a major plane as indicated by an arrow 2 in FIG. 1A. The flexible substrate 10 includes a flexible backing layer 12 with an adhesive surface 14. The flexible backing layer 12 can include, for example, a polymer film such as a flexible polymer including, e.g., urethane, acrylate, silicone, polyester, polyimide, etc. The adhesive surface 14 can include any suitable adhesives such as, for example, acrylate, silicone, urethane, etc. It is to be understood that the backing layer 12 and the substrate 10 can also be at least partially rigid. In some embodiments, the substrate 10 can form a circuit board including various circuitries or electronic components.

A flexible electronic component 20 is attached to the adhesive surface 14. The substrate 10 further includes an encapsulant layer 16 attached to the flexible backing layer 12 on the first side 10a thereof. The flexible electronic component 20 is sandwiched between the flexible backing layer 12 and the encapsulant layer 16.

In the depicted embodiment of FIGS. 1A-B and 2A-B, the flexible electronic component 20 is an electrically conductive wire buried inside the flexible substrate 10. The electrically conductive wire may have a diameter, for example, from about 10 micrometers to about 2 mm. The wire material could include any suitable metal (e.g., Cu) or other electrically conductive materials. In some embodiments, the conductive element can be a metal wire sheathed along its length, but for a few areas where the metal is exposed to make electrical contact. In some embodiments, the conductive element may include traces of metal or other electrically conductive material on a flexible substrate. It is to be understood that the flexible electronic component 20 can be any types of electronic component other than an electrically conductive wire.

The wire 20 is embedded in the flexible substrate 10, extends within the major plane 2 of the flexible substrate 10, and has a free end 22 adjacent to an edge 11 of the flexible substrate 10. In many embodiments, circuitries such as, for example, one or more IC chips (not shown), can be disposed on the substrate 10. For example, an IC chip can be attached to the adhesive surface 14 and then be covered by the encapsulant layer 16. The electrically conductive wire 20 can be electrically connected to one or more components of the circuitries. In the depicted embodiments, the circuitries further include electrodes or contact pads 5 formed in through-holes extending through the backing layer 12 and the adhesive surface 14. The electrically conductive wire 20 electrically connects to the electrodes 5.

In some embodiments, the electrodes 5 can be formed by providing conductive particle-containing liquid into holes extending through the backing layer 12 and the adhesive surface 14. The conductive particle-containing liquid may include conductive inks including a conductive metal such as silver ink, silver nanoparticle ink, reactive silver ink, copper ink, and conductive polymer inks, as well as liquid metals or alloys (e.g., metals or alloys that melt at relatively low temperatures and solidify at room temperatures), and the like. The conductive particle-containing liquid can be cured or solidified by removing at least portion of the liquid carrier to leave a continuous layer of electrically conductive material that forms an electrically conductive contact in the holes or other microstructures on the substrate 10.

A laser beam 31, generated by a laser (not shown), is directed and focused on to the major surface 10b of the flexible substrate 10. The beam 31 is moved over a selected portion of the major surface 10a or 10b to etch the substrate material at the edge 11 to expose the free end 22 of the wire 20. A laser steering system can be used to control the movement of the laser beam 31 over the flexible substrate 10. The laser beam 31 can have any suitable wavelength suitable for the application of removing the type of substrate material. For example, the wavelengths of green (about 532 urn), UV (about 266 nm), IR (about 1,064 nm), or $CO_2$ (about 10,640 nm), among others, can be used.

Figure 2A:
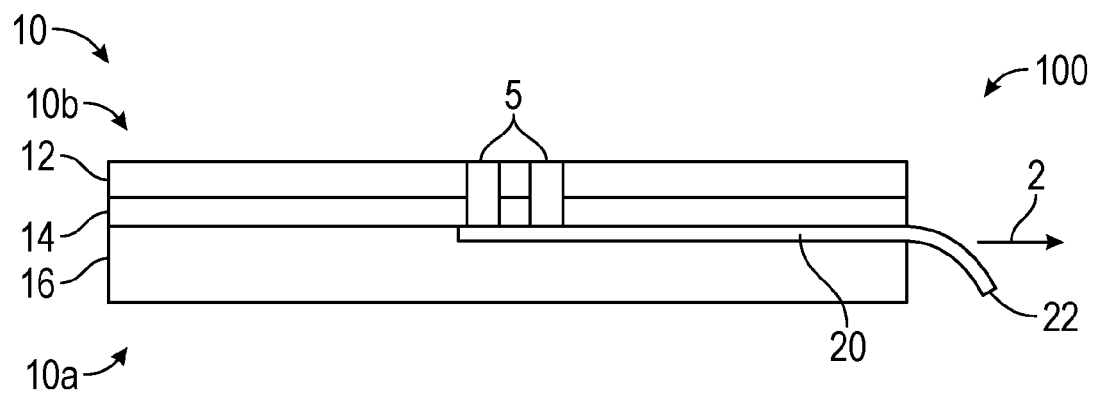
FIG. 2A is a cross-sectional view of a device obtained from the device of FIG. 1A, according to one embodiment.
Figure 2B:
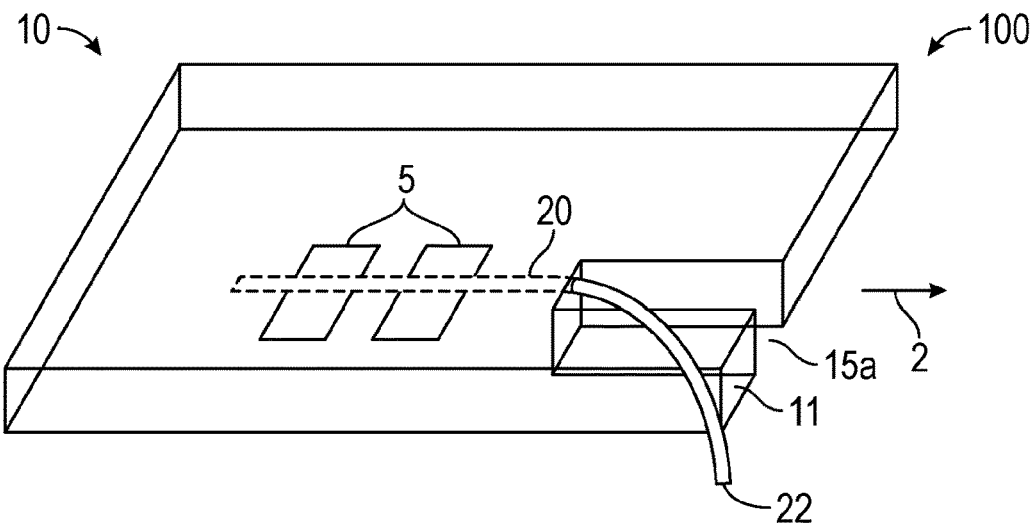
FIG. 2B is a perspective side view of the device of FIG. 2A.
Figure 3A:
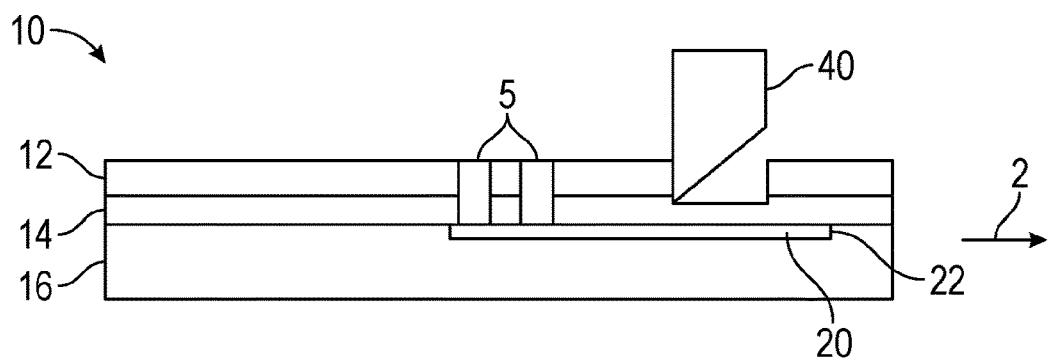
FIG. 3A is a cross-sectional view of a device, according to one embodiment.
Figure 3B:
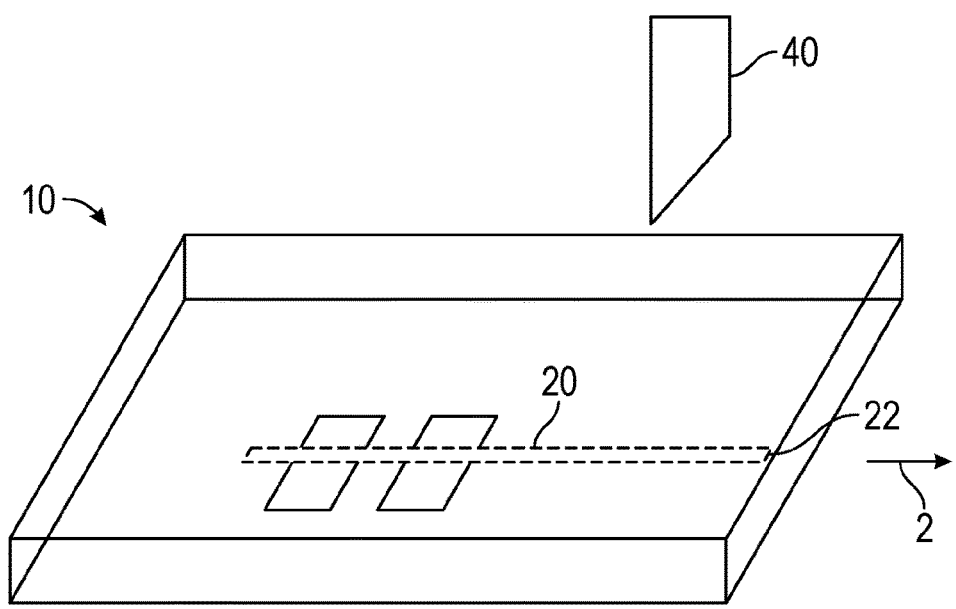
FIG. 3B is a perspective side view of the device of FIG. 3A.
Figure 4A:
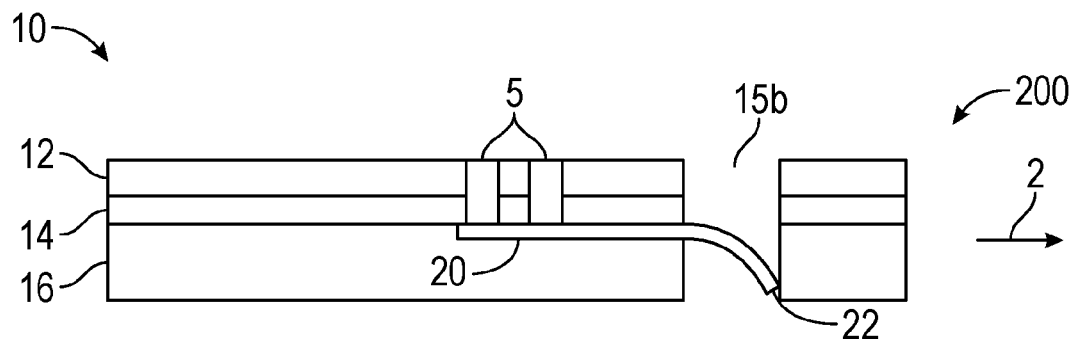
FIG. 4A is a cross-sectional view of a device obtained from the device of FIG. 3A, according to one embodiment.
Figure 4B:
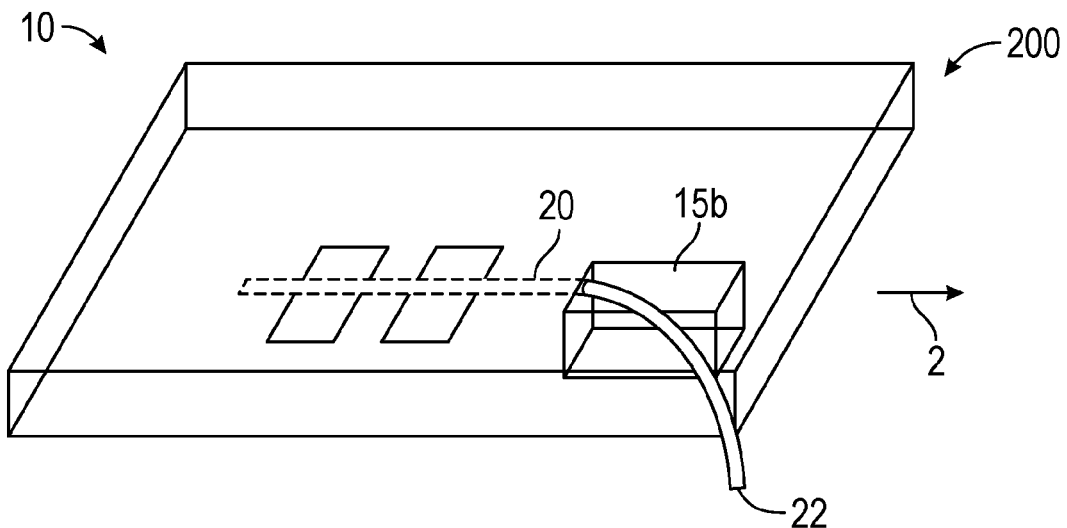
FIG. 4B is a perspective side view of the device of FIG. 4A.

As shown in FIG. 2B, a window 15a is formed by laser-etching the substrate material. The window 15a has a size to allow the embedded wire 20 being partially extracted from the substrate 10 such that the free end 22 projects out of the major plane 2 of the flexible substrate 10. In some embodiments, the free end 22 of the wire 20 can stick out and act as a probe to contact an object surface (e.g., skin) to be detected.

FIGS. 3A-B and 4A-B illustrate a method of making an electronic device 200 using a needle 40, according to another embodiment. The needle 40 is provided to cut through the flexible substrate 10 and pull out the free end 22 of the flexible electronic component 20. In some embodiments, the needle 40 can be, for example, a hypodermic needle hollow from inside. The inner diameter (ID) of the needle 40 can be larger than the outer diameter (OD) of the wire 20, such that the needle 40 can pick the wire 20 on its way through the flexible substrate 10. The needle 40 creates a window 15b extending through the substrate 10, from which the free end 22 of the wire 20 sticks out of the major plane 2 of the substrate 10. It is to be understood that the needle 40 may have various suitable configurations to pick up the wire 20 and pull the wire 20 through the window 15b.

Figure 5A:
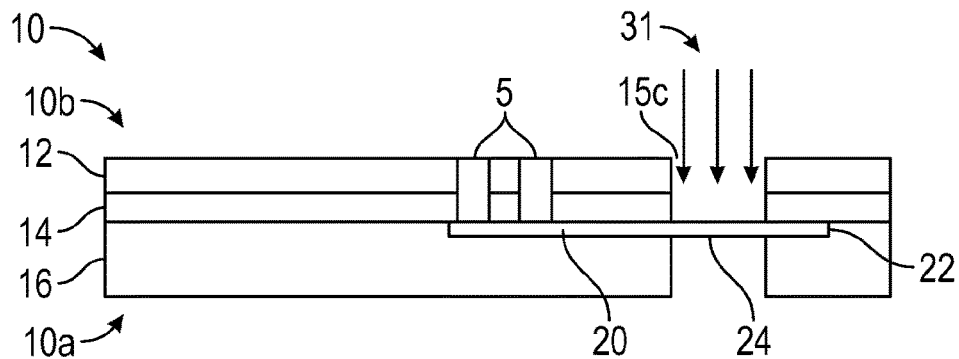
FIG. 5A is a cross-sectional view of a device where a window is formed by laser-etching, according to one embodiment.
Figure 5B:
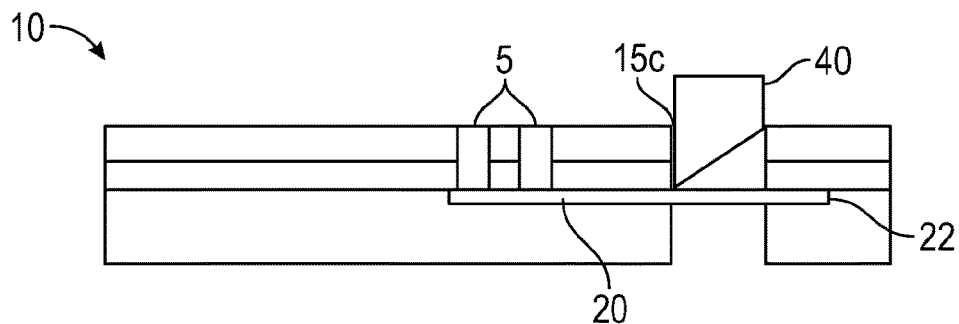
FIG. 5B is a cross-sectional view of the device of FIG. 5A where a needle is used.
Figure 5C:
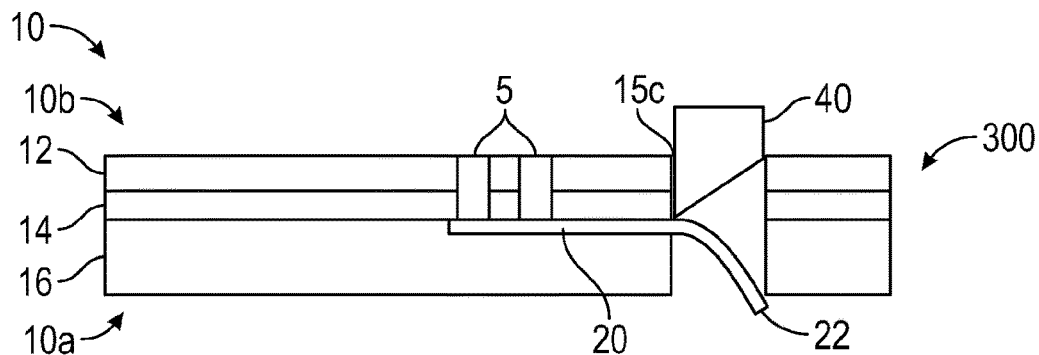
FIG. 5C is a cross-sectional view of a device obtained from the device of FIG. 5B.

FIGS. 5A-C illustrate a method of making an electronic device 300, according to another embodiment. The laser beam 31 is directed and focused on to the major surface 10a or 10b of the flexible substrate 10. The beam 31 is moved over a selected portion of the substrate 10 to etch the substrate material to form a window 15c which exposes a portion 24 of the wire 20 adjacent to the free end 22. The needle 40 is then inserted into the window 15c to pull out the free end 22 such that the free end 22 of the wire 20 sticks out of the major plane 2 of the substrate 10. In the depicted embodiment of FIG. 5C, the needle 40 can be secured in the window 15c to hold the wire 20 such that the free end 22 projects from the substrate 10. In many embodiments, the free end 22 extends beyond the major surface 10a of the substrate 10.

Figure 6:
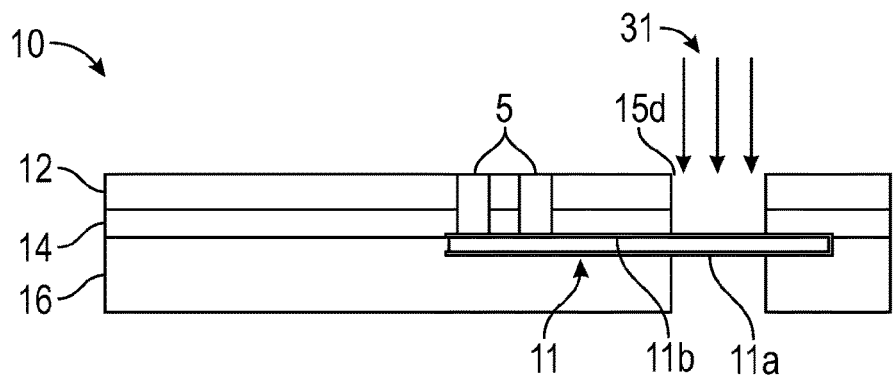
FIG. 6 is a cross-sectional view of a device including a sheathed metal wire, according to one embodiment.

In some embodiments, the wire 10 of electrically conductive material may be at least partially sheathed by another material such as, for example, a polymer, a metal, etc., to protect the wire from a laser beam. FIG. 6 illustrates an embodiment where an electrically conductive wire 11 includes a sheath 11a around the wire of electrically conductive material 11b. The properties of the sheath material (e.g., thickness, thermal conductivity, melting point, etc.) are suitable for preventing the build-up of heat in the wire 20 during laser ablation. A window 15d can be formed by the laser-etching, through which a portion of the wire 11 can be extracted.

Figure 7A:
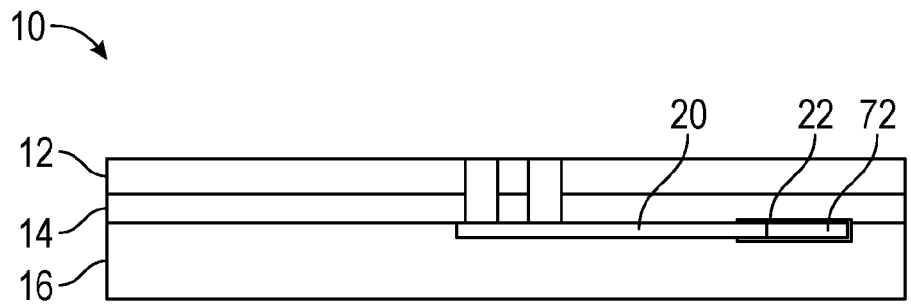
FIG. 7A is a cross-sectional view of a device including a cap, according to one embodiment.
Figure 7B:
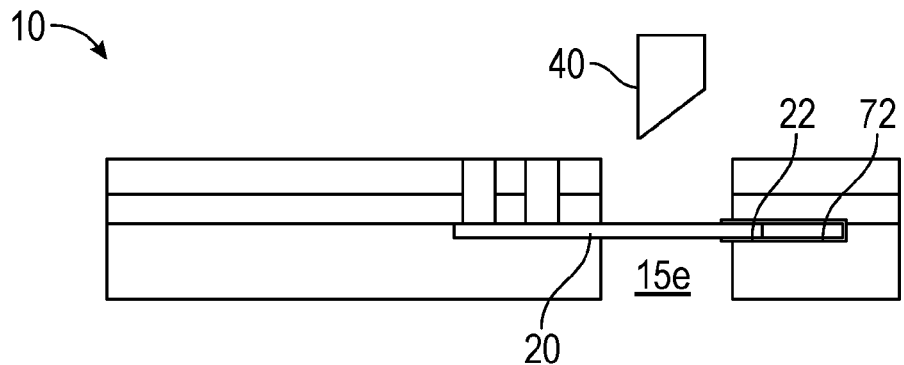
FIG. 7B is a cross-sectional view of the device of FIG. 7A where a needle is used.

In the embodiment depicted in FIGS. 5A-C, the free end 22 of the wire 20 is still buried in the substrate 10 after the formation of the window 15c via laser-etching. In some embodiments, the free end 22 of the wire 20 can be surface-treated for easy release from the substrate 10 upon the pulling-out via the needle 40. In the embodiment depicted in FIGS. 7A-C, the free end 22 of the wire 20 is placed in a cap 72 buried in the substrate 10. A window 15e can be created by a needle, a laser etching, or a combination thereof on the substrate 10. When the needle 40 is inserted into the window 15e to pull out the wire 20, the free end 22 of the wire 20 can be removed from the cap 72 and sticks out of the major plane 2 of the substrate 10. The cap 72 can be made of any suitable materials and have various configurations to allow the easy release of the free end 22 therefrom.

Figure 7C:
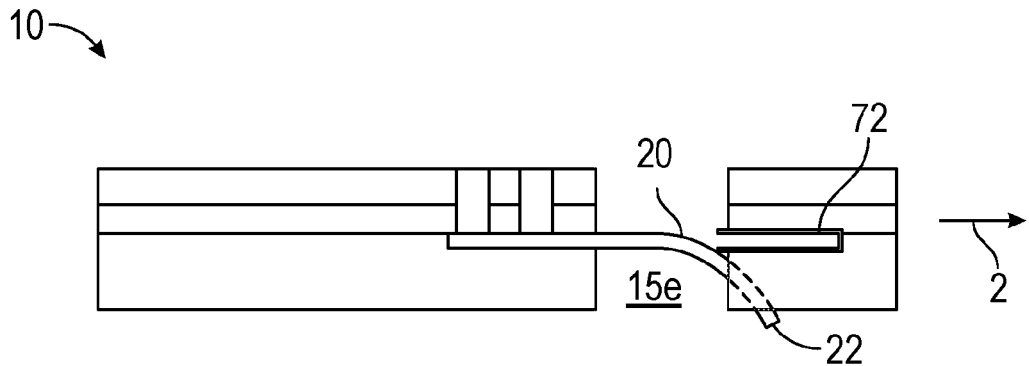
FIG. 7C is a cross-sectional view of a device obtained from the device of FIG. 7B.
Figure 8A:
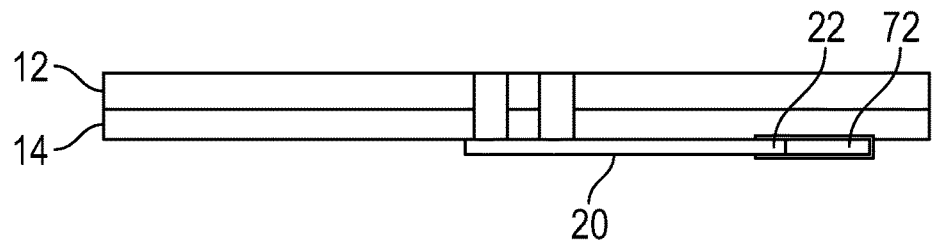
FIG. 8A is a cross-sectional view of a device, according to one embodiment.
Figure 8B:
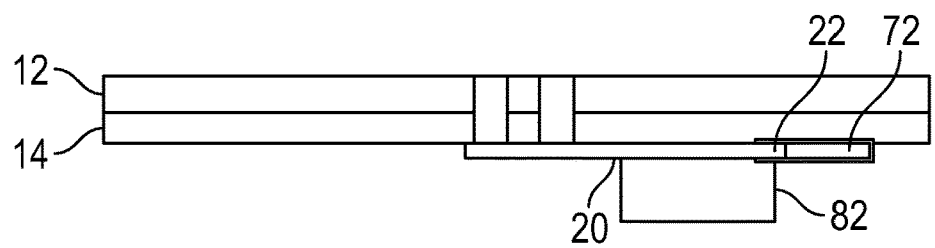
FIG. 8B is a cross-sectional view of the device of FIG. 8A where a plug is applied.
Figure 8C:
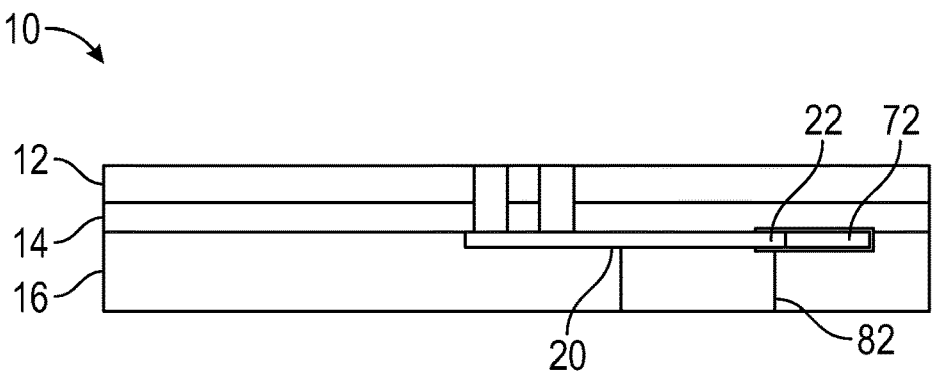
FIG. 8C is a cross-sectional view of the device of FIG. 8B where an encapsulant layer is applied.
Figure 8D:
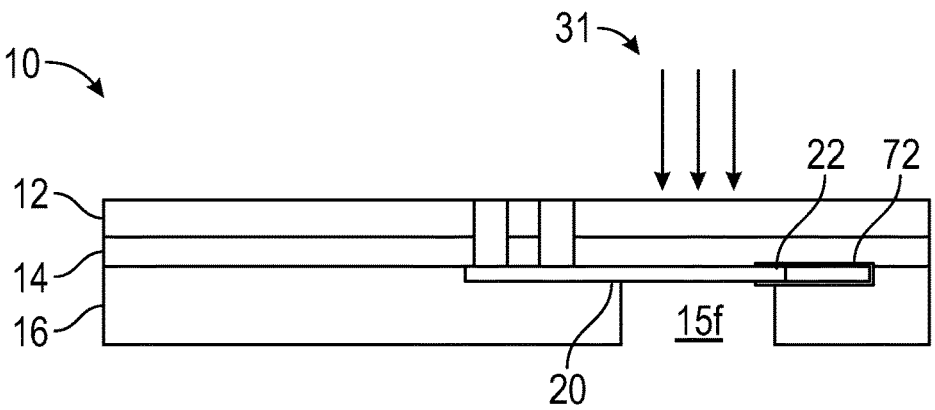
FIG. 8D is a cross-sectional view of a device obtained from the device of FIG. 8C by removing the plug.
Figure 9A:
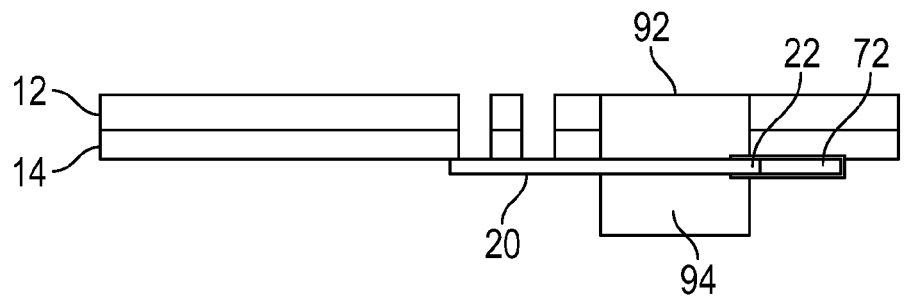
FIG. 9A is a cross-sectional view of a device including two plugs, according to one embodiment.
Figure 9B:
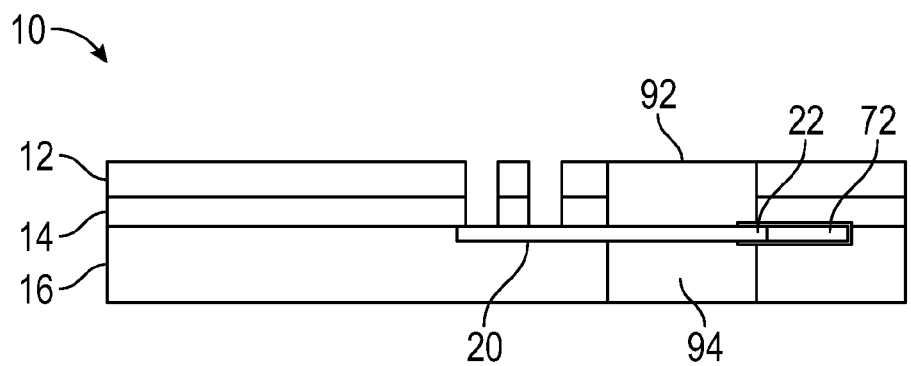
FIG. 9B is a cross-sectional view of the device of FIG. 9A where an encapsulant layer is applied.
Figure 9C:
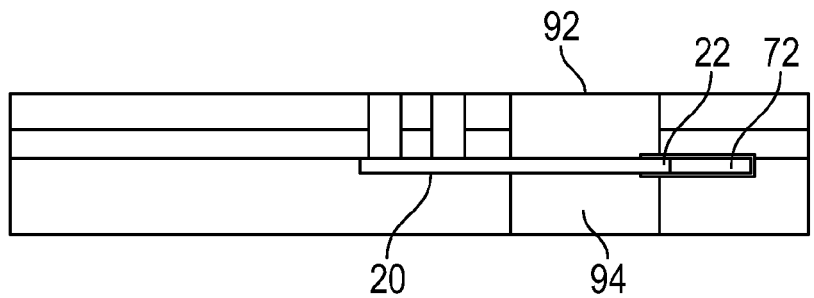
FIG. 9C is a cross-sectional view of the device of FIG. 9B where electrodes are formed in through-holes.
Figure 9D:
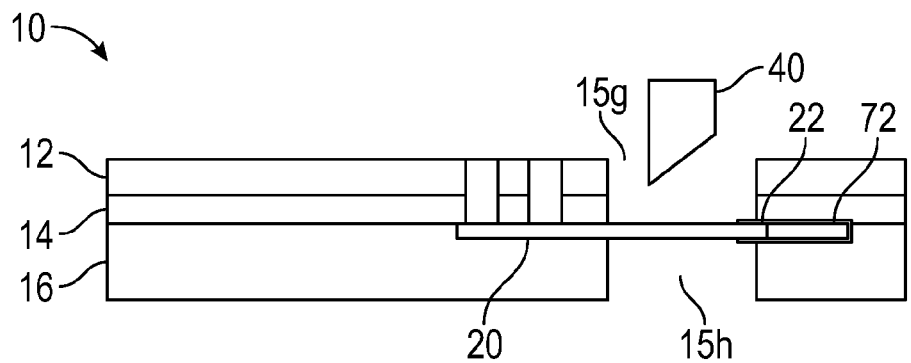
FIG. 9D is a cross-sectional view of a device obtained from the device of FIG. 9C by removing the plugs.
Figure 10A:
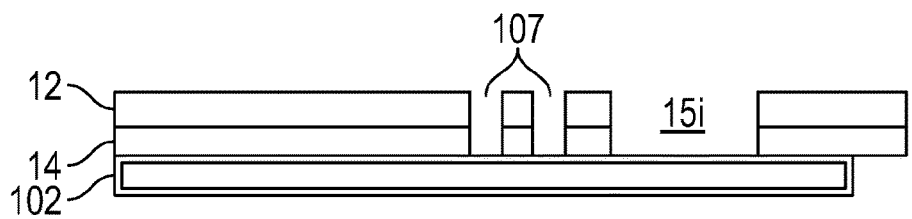
FIG. 10A is a cross-sectional view of a device including a removable piece, according to one embodiment.
Figure 10B:
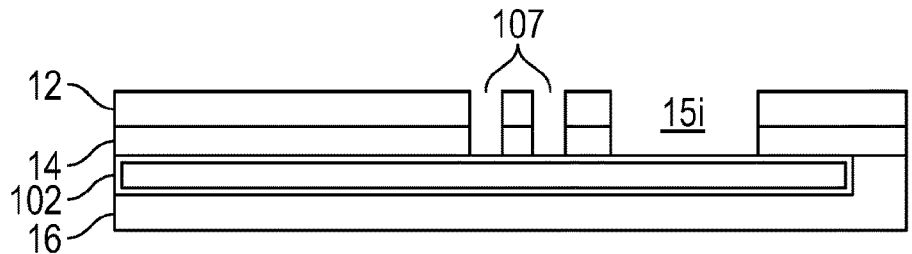
FIG. 10B is a cross-sectional view of the device of FIG. 10A where an encapsulant layer is applied.
Figure 10C:
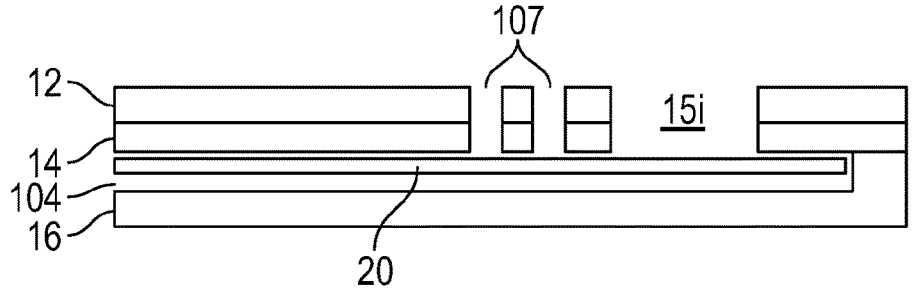
FIG. 10C is a cross-sectional view of the device of FIG. 10B where a wire is inserted into a cavity.
Figure 10D:
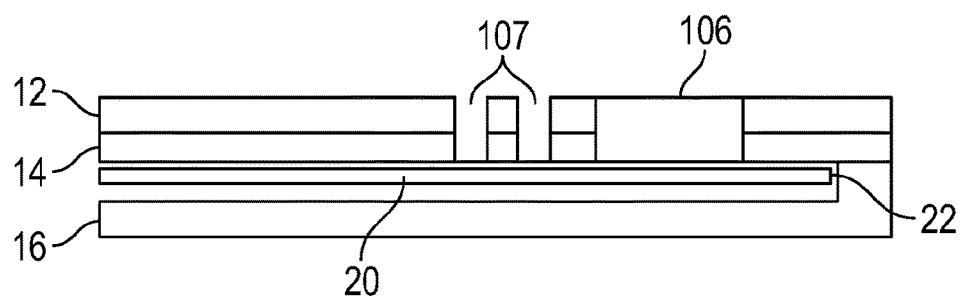
FIG. 10D is a cross-sectional view of the device of FIG. 10C where a plug is provided.
Figure 10E:
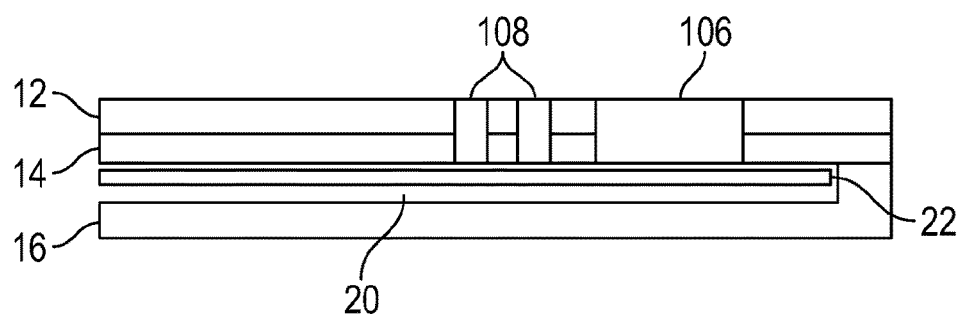
FIG. 10E is a cross-sectional view of the device of FIG. 10D where electrodes are formed in through-hole.
Figure 10F:
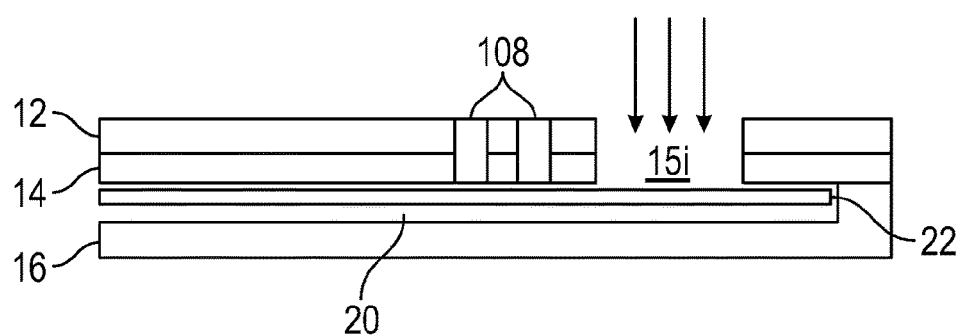
FIG. 10F is a cross-sectional view of a device obtained from the device of FIG. 9C by removing the plug.

In some embodiments, one or more plugs can be used to create a window on the substrate 10, through which a free end of an embedded electrical component (e.g., an electrically conductive wire) can be extracted to project out of the major plane of the substrate. In the embodiment depicted in FIGS. 8A-D, a plug 82 is positioned on the adhesive surface 14 of the substrate 10, in contact to the wire 20 adjacent to the free end 22 which is placed inside the cap 72. The plug 82 is removed from the adhesive surface 14, leaving a window 15f extending through the encapsulant layer 16. A laser beam 31 can be used to etch the substrate material to further expose a portion of the wire 20 adjacent to the window 15f. Then a needle can be used to pull the free end 22 of the wire 20 out of the cap 72 to stick out of the substrate 10, similar as shown in FIG. 7C.

In the embodiment depicted in FIGS. 9A-D, first and second plugs 92 and 94 are positioned on the two sides of the wire 20 adjacent to the free end 22 which is placed inside the cap 72. The first plug 92 can be placed into a window 15g formed in the backing layer 12. The second plug 94 can be placed on the adhesive surface 14, which is then covered by the encapsulant layer 16. The plugs 92 and 94 are then removed from the substrate 10, leaving the back-to-back windows 15g and 15h in the substrate 10. Then a needle 40 can be used to pull the free end 22 of the wire 20 out of the cap 72 to stick out of the substrate 10. A laser beam may not be used for this embodiment.

In the embodiment depicted in FIGS. 10A-D, a removable piece 102 is provided on the adhesive surface 14 of the substrate 10, which is then covered by the encapsulant layer 16. When the removable piece 102 is removed from the substrate 10, a cavity 104 is formed. The wire 20 can be inserted into the cavity 104 and attached to the adhesive surface 14. The backing layer 12 further includes a window 15i to receive a plug 106, and one or more through-holes 107 to form contacts 108 which electrically connect to the wire 20. Then the plug 106 can be removed. Laser-etching and/or needle-pulling can be applied to extract the free end 22 of the wire 20 to project out of the substrate 10.

Figure 11A:
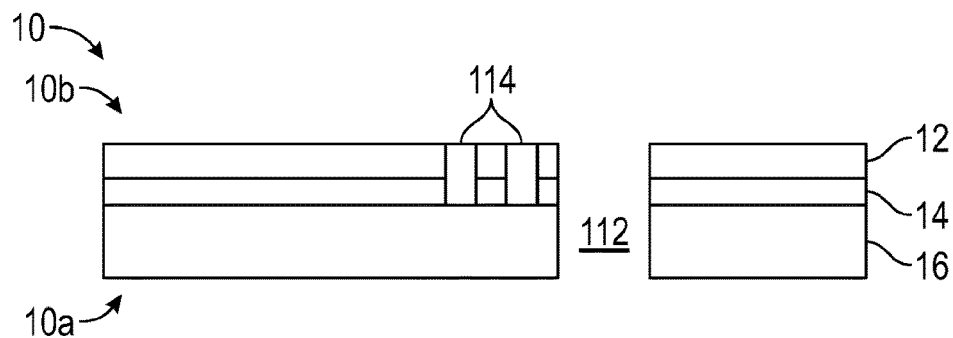
FIG. 11A is a cross-sectional view of a device including a window, according to one embodiment.
Figure 11B:
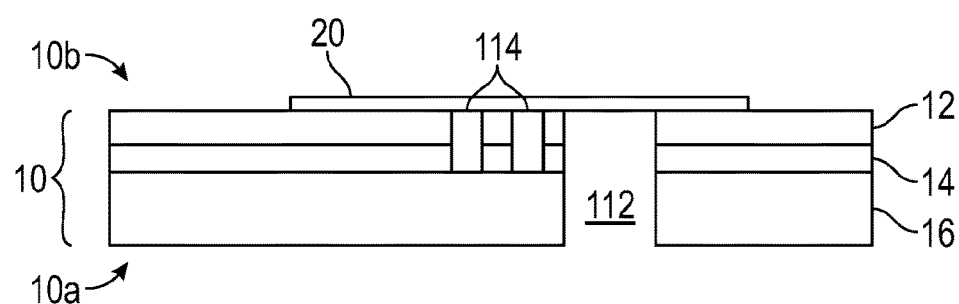
FIG. 11B is a cross-sectional view of the device of FIG. 11A where an electrically conductive wire is applied.
Figure 11C:
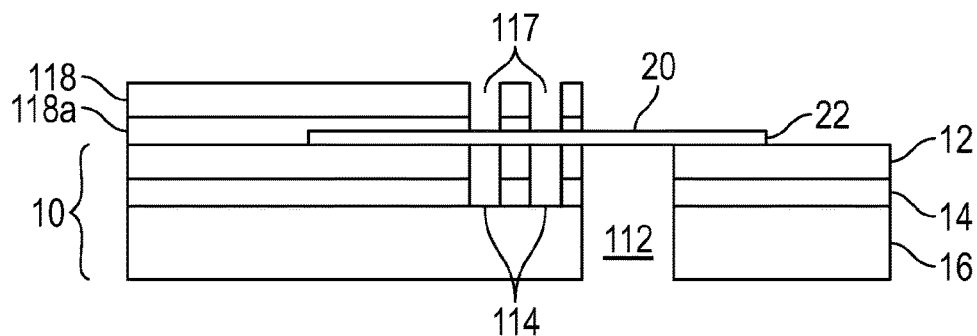
FIG. 11C is a cross-sectional view of the device of FIG. 11B where an adhesive film is applied.

FIGS. 11A-E illustrate a method of making a device 400, according to one embodiment. As shown in FIG. 11A, the substrate 10 includes one or more electrodes or contact pads 114 formed on the side 10b of the substrate 10. The substrate 10 further includes an optional window or through hole 112 extending through the substrate 10. As shown in FIG. 11B, a flexible electronic component 20 (e.g., an electrically conductive wire) is provided on the side 10b of the substrate 10 to be in contact with the electrodes 114. As shown in FIG. 11C, a flexible adhesive film 118 has an adhesive surface 118a to cover and secure the wire 20 on the flexible backing layer 12. The flexible adhesive film 118 includes through-holes 117 aligned with the electrodes 114 on the substrate 10. The wire 20 is secured in a position on the substrate 10 such that the wire 20 is in contact with the electrodes 114 and extends across the through hole 117. The wire 20 may also extend across the optional window 112.

Figure 11D:
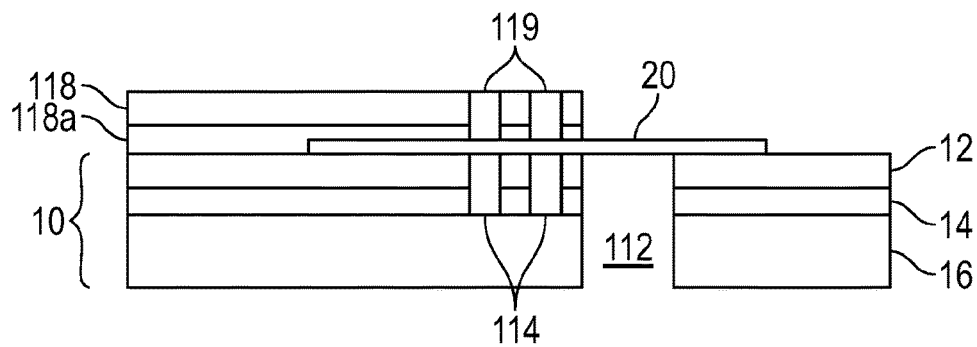
FIG. 11D is a cross-sectional view of the device of FIG. 11C where electrodes are formed in through-hole.

As shown in FIG. 11D, electrodes 119 can be formed in the through-holes 117, electrically connected to the wire 20 and the electrodes 114. In some embodiments, the electrodes 119 can be formed by providing conductive particle-containing liquid into the through-holes 117. The conductive particle-containing liquid may include conductive inks including a conductive metal such as silver ink, silver nanoparticle ink, reactive silver ink, copper ink, and conductive polymer inks, as well as liquid metals or alloys (e.g., metals or alloys that melt at relatively low temperatures and solidify at room temperatures), and the like. The conductive particle-containing liquid can be cured or solidified by removing at least portion of the liquid carrier to leave a continuous layer of electrically conductive material that forms an electrically conductive contact in the through-holes 117 or other microstructures on the adhesive film 118. The electrodes 119 formed by solidifying a conductive ink in the through-holes can create a linkage between the wire 20 and the underneath electrodes 114.

Figure 11E:
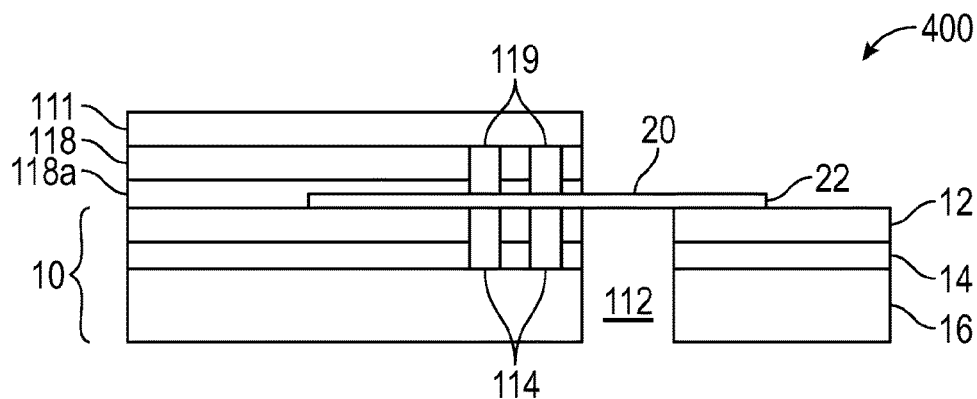
FIG. 11E is a cross-sectional view of the device of FIG. 11D where an encapsulant layer is applied.

As shown in FIG. 11E, an encapsulant layer 111 can be provided to cover the adhesive film 118 to protect the electrodes 119 and/or other circuitries formed thereon. The encapsulant layer 111 can be formed by a liquid-based encapsulation process. In some embodiments, liquid encapsulants can be applied on the surface of the device and solidified to form the encapsulant layer. For example, the liquid encapsulants can be cured by heat or UV. A needle can be provided to insert into the window 112 from the side 10a of the substrate 10 to extract the free end 22 of the wire 20 to stick out of the substrate 10.

The device 400 of FIG. 11E has a multilayer structure which includes an adhesive film 118 having (i) the adhesive surface 11 to attach the substrate 10 and (ii) the electrodes 119 in the through-holes of the adhesive film 118 to make electrical contacts to the underneath electrodes in the substrate 10. In this manner, electrical contacts can be provided to electrical components supported by the substrate 10. Exemplary electrical components may include, for example, IC chips, resistors, radio-frequency identification (RFID) tags, near field communication (NFC) circuits, Bluetooth circuits, Wi-Fi circuits, microprocessor chips, bare dies, capacitors, accelerometer chips, and the like.

Conventionally, electrical bonding materials such as solder and conductive epoxy are used to (i) establish electrical contacts between electrical components supported by the substrate and (ii) establish adhesion between the electrical component and the substrate. In these typical processes, the electrical bonding materials may be subjected to elaborated curing procedure, which may include, for example, high temperatures in excess of 250° C. for solders or a long hold time (up to hours) for a conductive epoxy.

The exemplary process to make the device 400 in FIGS. 11A-E can decouple the conduction and adhesion aspects by utilizing a two-material system including conductive inks for forming electrodes and adhesive films for adhesion. This approach enables a low-temperature and short curing cycle, which is beneficial for high volume manufacturing.

The operation of the present disclosure will be further described with regard to the following embodiments. These embodiments are offered to further illustrate the various specific and preferred embodiments and techniques. It should be understood, however, that many variations and modifications may be made while remaining within the scope of the present disclosure.

LISTING OF EXEMPLARY EMBODIMENTS

It is to be understood that any one of embodiments 1-10, 11-15, 16-18, and 19-20 can be combined.

Embodiment 1 is a method of making a flexible device, comprising:
    providing a flexible substrate extending along a major plane:
    providing a flexible electronic component including a free end buried inside the flexible substrate; and
    extracting the free end of the flexible electronic component such that the free end projects out of the major plane of the flexible substrate.

Embodiment 2 is the method of embodiment 1, wherein extracting the free end further comprises at least partially laser-etching a portion of the flexible substrate.

Embodiment 3 is the method of embodiment 2, wherein the portion of the flexible substrate incudes an edge of the flexible substrate.

Embodiment 4 is the method of any one of embodiments 1-3, wherein extracting the free end further comprises using a hollow needle to at least partially cut through the flexible substrate and pull out the free end of the flexible electronic component.

Embodiment 5 is the method of embodiment 4, further comprising providing a cap to receive the free end of the flexible electronic component within the flexible substrate, wherein the free end is removable from the cap when the hollow needle pulls the flexible electronic component.

Embodiment 6 is the method of any one of embodiments 1-5, further comprising providing one or more removable plugs at least partially embedded in the flexible substrate to support the flexible electronic component.

Embodiment 7 is the method of any one of embodiments 1-6, wherein the flexible electronic component includes an electrically conductive wire.

Embodiment 8 is the method of embodiment 7, wherein the electrically conductive wire includes a metallic sheath.

Embodiment 9 is the method of any one of embodiments 1-8, wherein the flexible substrate includes a polymer film and an adhesive layer disposed thereon, and the flexible electronic component is disposed on the adhesive layer.

Embodiment 10 is the method of embodiment 9, wherein the flexible substrate further includes a polymer encapsulant layer to cover the flexible electronic component.

Embodiment 11 is a flexible device comprising:
a flexible substrate extending along a major plane; and
a flexible electronic component buried inside the flexible substrate,
wherein the flexible electronic component includes a free end sticking out of the major plane of the flexible substrate.

Embodiment 12 is the device of embodiment 11, wherein the flexible electronic component includes an electrically conductive wire.

Embodiment 13 is the device of embodiment 11 or 12, wherein the flexible substrate further includes a polymer film and an adhesive layer disposed thereon, and the flexible electronic component is disposed on the adhesive layer.

Embodiment 14 is the device of any one of embodiments 11-13, further comprising a hollow needle penetrating through the flexible substrate and supporting the free end of the flexible electronic component.

Embodiment 15 is the device of any one of embodiments 11-14, wherein the flexible substrate includes a window through which the free end sticks out of the major plane of the flexible substrate.

Embodiment 16 is a method of making a device comprising:
providing a circuit board including one or more contact pads on a major surface thereof:
providing an electrically conductive element disposed on the major surface of the circuit board, in contact with the one or more contact pads:
providing an adhesive film adhesively bonded to the major surface of the circuit board to secure the electrically conductive element thereon, the adhesive film including one or more through holes aligned with the one or more contact pads of the circuit board:
providing a conductive particle-containing liquid in the one or more through holes to contact the one or more contact pads; and
solidifying the conductive particle-containing liquid to form one or more electrodes to electrically connect to the one or more contact pads of the circuit board and the electrically conductive element.

Embodiment 17 is the method of embodiment 16, further comprising providing an encapsulant layer to cover the adhesive film.

Embodiment 18 is the method of embodiment 16 or 17, further comprising extracting a free end of the electrically conductive element such that the free end projects out of the major plane of the circuit board.

Embodiment 19 is a device comprising:
a circuit board including one or more contact pads on a major surface thereof;
an electrically conductive element disposed on the major surface of the circuit board, in contact with the one or more contact pads;
an adhesive film adhesively bonded to the major surface of the circuit board to secure the electrically conductive element thereon, the adhesive film including one or more through holes aligned with the one or more contact pads of the circuit board; and
one or more electrodes formed in the one or more through holes of the adhesive film to electrically connect to the one or more contact pads of the circuit board and the electrically conductive element.

Embodiment 20 is the device of embodiment 19 further comprising an encapsulant layer to cover the adhesive film.

The operation of the present disclosure will be further described with regard to the following detailed examples. These examples are offered to further illustrate the various specific and preferred embodiments and techniques. It should be understood, however, that many variations and modifications may be made while remaining within the scope of the present disclosure.

EXAMPLES

These Examples are merely for illustrative purposes and are not meant to be overly limiting on the scope of the appended claims. Notwithstanding that the numerical ranges and parameters setting forth the broad scope of the present disclosure are approximations, the numerical values set forth in the specific examples are reported as precisely as possible. Any numerical value, however, inherently contains certain errors necessarily resulting from the standard deviation found in their respective testing measurements. At the very least, and not as an attempt to limit the application of the doctrine of equivalents to the scope of the claims, each numerical parameter should at least be construed in light of the number of reported significant digits and by applying ordinary rounding techniques.

Summary of Materials

Unless otherwise noted, all parts, percentages, ratios, etc. in the Examples and the rest of the specification are by weight. In addition, Table 1 provides abbreviations and a source for all materials used in the Examples below:

TABLE 1

| Abbreviation | Description | Source |
| --- | --- | --- |
| PET substrate | 0.075 mm thick polyester PET | Tekra Inc., New Berline, WI |

TABLE 1-continued

| Abbreviation | Description | Source |
| --- | --- | --- |
| Adhesive 200MP | High-performance acrylic adhesive | 3M Company, St. Paul, MN |
| Ink | a silver flake ink that becomes conductive after solidification, available under the trade designation 127-07. | Creative Materials Inc, Ayer, MA |

Example 1

Figure 12:
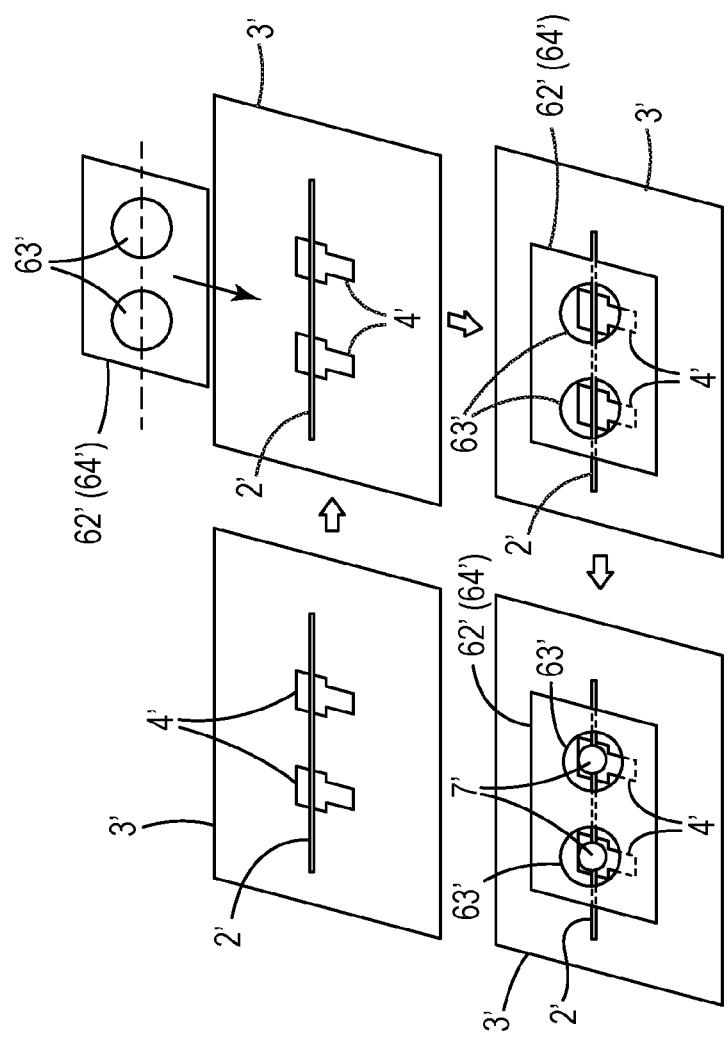
FIG. 12 is a schematic diagram of a process to make Example 1.

As shown in FIG. 12, a 250-micrometer diameter Cu wire was placed on a flexible substrate (a circuit board). The substrate had two Cu contact pads and other circuities. A 3.5 mil (0.089 mm) thick PU film was laminated to 1 mil (0.025 mm) thick 3M 200MP adhesive film. Two through-holes at least 1 mm in diameter were laser drilled through the stack. The dilled PU adhesive film was placed on to the circuit, lining up the through-holes to the pads on the circuit board. The Cu wire is now secured under the adhesive. Silver ink was jetted in the holes on top of the wire, creating a linkage between the wire and the contact pads underneath. Full electrical connection was created by heating the ink to 100° C. for 5 minutes in a convection oven. Electrical measurements were performed by placing the probes on the two contact pads and measuring the resistance across them. Resistance measured just after fabrication and after ageing test were about 0.7 Ohms.

Example 2

Figure 13:
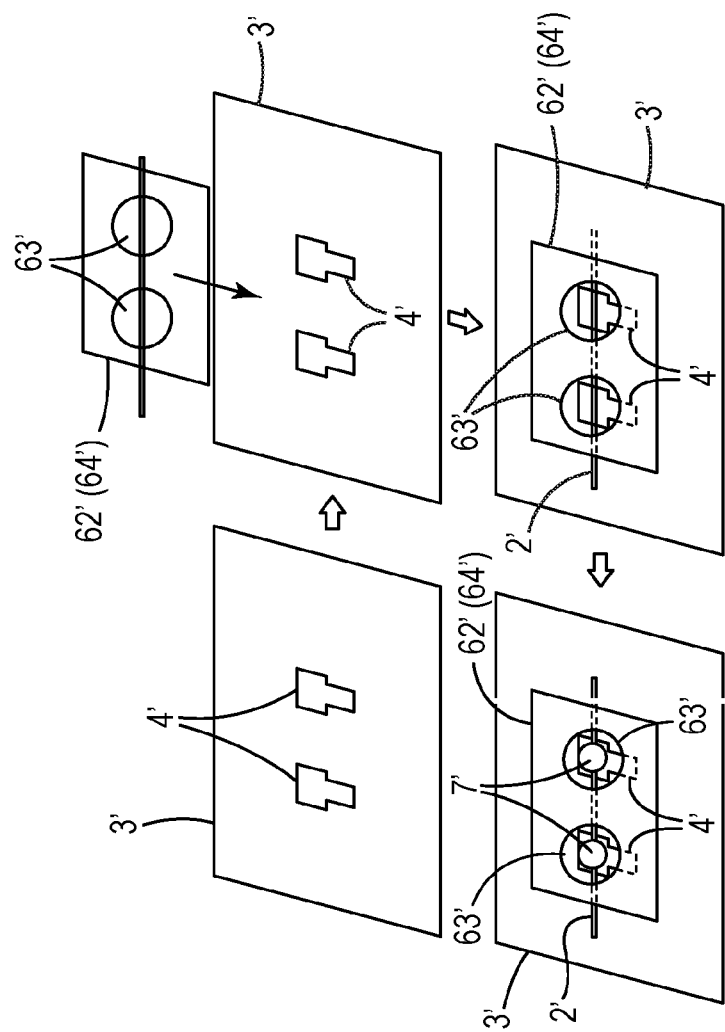
FIG. 13 is a schematic diagram of a process to make Example 2.

As shown in FIG. 13, a 250-micrometer diameter Cu wire was pre-assembled onto the 3.5 mil thick PU adhesive film including 1 mil (0.025 mm) thick 3M 200MP adhesive film, and subsequently placed on a flexible substrate (circuit board). The substrate had two Cu contact pads and other circuities. Two through-holes at least 1 mm in diameter were laser drilled through the stack. The dilled PU adhesive film was placed on to the circuit board, lining up the through-holes to the pads on the circuit board. The Cu wire is now secured under the adhesive. Silver ink was jetted in the holes on top of the wire, creating a linkage between the wire and the contact pads underneath. Full electrical connection was created by heating the ink to 100° C. for 5 minutes in a convection oven. Electrical measurements were performed by placing the probes on the two contact pads and measuring the resistance across them. Resistance measured just after fabrication and after ageing test were about 0.7 Ohms.

Reference throughout this specification to "one embodiment," "certain embodiments," "one or more embodiments" or "an embodiment," whether or not including the term "exemplary." preceding the term "embodiment," means that a particular feature, structure, material, or characteristic described in connection with the embodiment is included in at least one embodiment of the certain exemplary embodiments of the present disclosure. Thus, the appearances of the phrases such as "in one or more embodiments," "in certain embodiments," "in one embodiment" or "in an embodiment" in various places throughout this specification are not necessarily referring to the same embodiment of the certain exemplary embodiments of the present disclosure. Furthermore, the particular features, structures, materials, or characteristics may be combined in any suitable manner in one or more embodiments.

While the specification has described in detail certain exemplary embodiments, it will be appreciated that those skilled in the art, upon attaining an understanding of the foregoing, may readily conceive of alterations to, variations of, and equivalents to these embodiments.

Accordingly, it should be understood that this disclosure is not to be unduly limited to the illustrative embodiments set forth hereinabove. In particular, as used herein, the recitation of numerical ranges by endpoints is intended to include all numbers subsumed within that range (e.g., 1 to 5 includes 1, 1.5, 2, 2.75, 3, 3.80, 4, and 5). In addition, all numbers used herein are assumed to be modified by the term "about."

Furthermore, all publications and patents referenced herein are incorporated by reference in their entirety to the same extent as if each individual publication or patent was specifically and individually indicated to be incorporated by reference. Various exemplary embodiments have been described. These and other embodiments are within the scope of the following claims.

What is claimed is:

1. A method of making a flexible device, comprising:
   providing a flexible substrate extending along a major plane;
   providing a flexible electronic component including a free end buried inside the flexible substrate; and
   extracting the free end of the flexible electronic component such that the free end projects out of the major plane of the flexible substrate;
   wherein extracting the free end comprises
   (A) at least partially laser-etching a portion of the flexible substrate, wherein the portion of the flexible substrate incudes an edge of the flexible substrate; or
   (B) using a hollow needle to at least partially cut through the flexible substrate and pull out the free end of the flexible electronic component.

2. The method of claim 1, wherein extracting the free end comprises at least partially laser-etching the portion of the flexible substrate, wherein the portion of the flexible substrate incudes an edge of the flexible substrate.

3. The method of claim 1, wherein extracting the free end comprises using the hollow needle to at least partially cut through the flexible substrate and pull out the free end of the flexible electronic component.

4. The method of claim 3, further comprising providing a cap to receive the free end of the flexible electronic component within the flexible substrate, wherein the free end is removable from the cap when the hollow needle pulls the flexible electronic component.

5. The method of claim 1, wherein the flexible electronic component includes an electrically conductive wire.

6. The method of claim 5, wherein the electrically conductive wire includes a metallic sheath.

7. The method of claim 1, wherein the flexible substrate includes a polymer film and an adhesive layer disposed thereon, and the flexible electronic component is disposed on the adhesive layer.

8. The method of claim 7, wherein the flexible substrate further includes a polymer encapsulant layer to cover the flexible electronic component.

9. A method of making a flexible device, comprising:
   providing a flexible substrate extending along a major plane;
   providing a flexible electronic component including a free end buried inside the flexible substrate; and extracting the free end of the flexible electronic component such that the free end projects out of the major plane of the flexible substrate;

wherein the method further comprises providing one or more removable plugs at least partially embedded in the flexible substrate to support the flexible electronic component.

10. The method of claim 9, wherein the flexible electronic component includes an electrically conductive wire.

11. The method of claim 9, wherein the flexible substrate includes a polymer film and an adhesive layer disposed thereon, and the flexible electronic component is disposed on the adhesive layer.

12. The method of claim 11, wherein the flexible substrate further includes a polymer encapsulant layer to cover the flexible electronic component.

13. A flexible device comprising:
a flexible substrate extending along a major plane; and
a flexible electronic component buried inside the flexible substrate, wherein the flexible electronic component includes a free end sticking out of the major plane of the flexible substrate;
wherein the flexible device further comprises a hollow needle penetrating through the flexible substrate and supporting the free end of the flexible electronic component.

14. The device of claim 13, wherein the flexible electronic component includes an electrically conductive wire.

15. The device of claim 13, wherein the flexible substrate further includes a polymer film and an adhesive layer disposed thereon, and the flexible electronic component is disposed on the adhesive layer.

16. The device of claim 13, wherein the flexible substrate includes a window through which the free end sticks out of the major plane of the flexible substrate.

17. A method of making a device comprising:
providing a circuit board including one or more contact pads on a major surface thereof;
providing an electrically conductive element disposed on the major surface of the circuit board, in contact with the one or more contact pads;
providing an adhesive film adhesively bonded to the major surface of the circuit board to secure the electrically conductive element thereon, the adhesive film including one or more through holes aligned with the one or more contact pads of the circuit board;
providing a conductive particle-containing liquid in the one or more through holes to contact the one or more contact pads; and
solidifying the conductive particle-containing liquid to form one or more electrodes to electrically connect to the one or more contact pads of the circuit board and the electrically conductive element;
wherein the method further comprises extracting a free end of the electrically conductive element such that the free end projects out of the major plane of the circuit board.

18. The method of claim 17, further comprising providing an encapsulant layer to cover the adhesive film.

* * * * *